US009136187B2

(12) United States Patent
Yu et al.

(10) Patent No.: US 9,136,187 B2
(45) Date of Patent: Sep. 15, 2015

(54) METHOD OF ADJUSTING A THRESHOLD VOLTAGE OF A TRANSISTOR IN THE FORMING OF A SEMICONDUCTOR DEVICE INCLUDING THE TRANSISTOR

(71) Applicants: SAMSUNG ELECTRONICS CO., LTD., Gyeonggi-do (KR); INFINEON TECHNOLOGIES AG, Bavaria (DE)

(72) Inventors: Cheong Sik Yu, Gyeonggi-do (KR); Choelhwyi Bae, Gyeonggi-do (KR); JaeHoo Park, Gyeonggi-do (KR); Knut Stahrenberg, Bavaria (DE)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 136 days.

(21) Appl. No.: 13/940,545

(22) Filed: Jul. 12, 2013

(65) Prior Publication Data

US 2015/0017746 A1      Jan. 15, 2015

(51) Int. Cl.
*H01L 21/00*        (2006.01)
*H01L 21/66*        (2006.01)

(52) U.S. Cl.
CPC ..................................... *H01L 22/14* (2013.01)

(58) Field of Classification Search
None
See application file for complete search history.

(56) References Cited

U.S. PATENT DOCUMENTS

| 6,934,200 | B2 | 8/2005 | Bhat et al. |
| 7,132,340 | B2 | 11/2006 | Sadra et al. |
| 7,537,940 | B2 | 5/2009 | Lee et al. |
| 7,736,916 | B2 * | 6/2010 | Aghababazadeh et al. ..... 438/11 |
| 7,795,085 | B2 | 9/2010 | Yoon et al. |
| 7,813,162 | B2 | 10/2010 | Zhu et al. |
| 7,871,871 | B2 | 1/2011 | Hishiki et al. |
| 2005/0009265 | A1 * | 1/2005 | Yoo et al. ...................... 438/231 |
| 2006/0088964 | A1 | 4/2006 | Jung et al. |
| 2006/0214164 | A1 | 9/2006 | Oguni |
| 2007/0018253 | A1 | 1/2007 | Liaw |
| 2010/0140617 | A1 * | 6/2010 | Kuroda ........................... 257/48 |
| 2011/0304350 | A1 * | 12/2011 | Christensen et al. .... 324/762.09 |

FOREIGN PATENT DOCUMENTS

| JP | 05-205481 | 8/1993 |
| JP | 2000-353754 | 12/2000 |
| KR | 10-1998-0046269 | 9/1998 |
| KR | 1020000045297 | 7/2000 |

* cited by examiner

*Primary Examiner* — Charles Garber
*Assistant Examiner* — Brigitte Paterson
(74) *Attorney, Agent, or Firm* — F. Chau & Associates, LLC

(57) ABSTRACT

A method of forming a semiconductor device includes forming a first transistor and a second transistor on a substrate, monitoring processes of forming the first and second transistors to find an error and performing an additional ion implantation process to form a low-concentration dopant region or a halo region on the first transistor or the second transistor corresponding to a found error.

20 Claims, 8 Drawing Sheets

METHOD OF ADJUSTING A THRESHOLD VOLTAGE OF A TRANSISTOR IN THE FORMING OF A SEMICONDUCTOR DEVICE INCLUDING THE TRANSISTOR

BACKGROUND

1. Technical Field

The inventive concept relates to methods of forming a semiconductor device.

2. Discussion of the Related Art

A static random access memory (SRAM) is a type of semiconductor memory.

Generally, an SRAM cell is made up of two pull-down elements, two access elements, and two pull-up elements. The SRAM cell may be categorized as a full complementary metal-oxide semiconductor (CMOS) cell, a high load resistor (HLR) cell, or a thin film transistor (TFT) cell according to the pull-up elements. The full CMOS cell uses p-channel bulk MOSFETs as the pull-up elements. The HLR cell uses polysilicon patterns having a high resistance value as the pull-up elements. The TFT cell uses p-channel poly-silicon TFTs as the pull-up elements.

SUMMARY

Exemplary embodiments of the inventive concept provide methods of forming a semiconductor device capable of reducing dispersion of threshold voltages.

According to an exemplary embodiment of the inventive concept, a method of forming a semiconductor device may include: forming a first transistor and a second transistor on a substrate; monitoring processes of forming the first and second transistors to find an error; and performing an additional ion implantation process to form a low-concentration dopant region or a halo region on the first transistor or the second transistor corresponding to a found error.

In an exemplary embodiment of the inventive concept, forming the first transistor and the second transistor may include: forming a device isolation layer on or in the substrate to define a first active region corresponding to a first column and a second active region corresponding to a second column; performing a channel ion implantation process on the first and second active regions; forming a first gate pattern and a second gate pattern on the first active region and the second active region, respectively; forming a first low-concentration dopant region in the substrate at first and second sides of the first gate pattern and a second low-concentration dopant region in the substrate at first and second sides of the second gate pattern; and forming a first halo region and a second halo region contacting the first low-concentration dopant region and the second low-concentration dopant region under the first gate pattern and the second gate pattern, respectively.

In an exemplary embodiment of the inventive concept, monitoring the processes of forming the first and second transistors may include: performing an overlay test to find a mask misalignment.

In an exemplary embodiment of the inventive concept, before the first and second transistors are formed, the method may further include: forming preliminary transistors under various mask misalignment conditions; and measuring threshold voltages of the preliminary transistors to gather back data.

In an exemplary embodiment of the inventive concept, the method may further include: predicting a difference between threshold voltages of the first and second transistors using the back data. The additional ion implantation process may compensate for the difference.

In an exemplary embodiment of the inventive concept, if a threshold voltage of the first transistor is smaller than a threshold voltage of the second transistor, the additional ion implantation process for the formation of the halo region may be performed using an ion implantation mask which exposes the first active region and covers the second active region.

In an exemplary embodiment of the inventive concept, if a threshold voltage of the first transistor is greater than a threshold voltage of the second transistor, the additional ion implantation process for the formation of the low-concentration dopant region may be performed using an ion implantation mask which exposes the first active region and covers the second active region.

In an exemplary embodiment of the inventive concept, if a threshold voltage of the second transistor is smaller than a threshold voltage of the first transistor, the additional ion implantation process for the formation of the halo region may be performed using an ion implantation mask which exposes the second active region and covers the first active region.

In an exemplary embodiment of the inventive concept, if a threshold voltage of the second transistor is greater than a threshold voltage of the first transistor, the additional ion implantation process for the formation of the low-concentration dopant region may be performed using an ion implantation mask which exposes the second active region and covers the first active region.

In an exemplary embodiment of the inventive concept, after performing the additional ion implantation process, the method may further include: forming a first spacer and a second spacer on sidewalls of the first and second gate patterns, respectively; and forming a first high-concentration dopant region and a second high-concentration dopant region in the substrate adjacent to sidewalls of the first and second spacers, respectively.

In an exemplary embodiment of the inventive concept, the additional ion implantation process may change a threshold voltage of the first or second transistor.

According to an exemplary embodiment of the inventive concept, a method of monitoring a semiconductor device may include: receiving an error signal indicating an error has occurred when forming a first transistor on a substrate; and outputting, based on the error, a command instructing a process used in the forming of the first transistor to be repeated, wherein the process includes an ion implantation process.

The command may include a mask type to be used in the repeated process.

The mask type may be based on a threshold voltage difference between the first transistor and a second transistor.

According to an exemplary embodiment of the inventive concept, a method of forming a semiconductor device may include: performing a first ion implantation process on a first transistor and a second transistor; and performing, in response to an error indication, a second ion implantation process on the first transistor, wherein the second ion implantation process adjusts a threshold voltage of the first transistor and uses a different mask than a mask used in the first ion implantation process.

The second ion implantation process may include a halo ion implantation process or a lightly doped drain ion implantation process.

The first and second ion implantation processes may be the same except for the mask.

The method may further include forming a spacer on sidewalls of each of the first and second transistors.

The threshold voltage of the first transistor and a threshold voltage of the second transistor may be substantially the same.

The semiconductor device may be a static random access memory.

BRIEF DESCRIPTION OF THE DRAWINGS

The above and other features of the inventive concept will become more apparent by describing in detail exemplary embodiments thereof with reference to the attached drawings, in which.

DETAILED DESCRIPTION OF THE EMBODIMENTS

Figure 1:
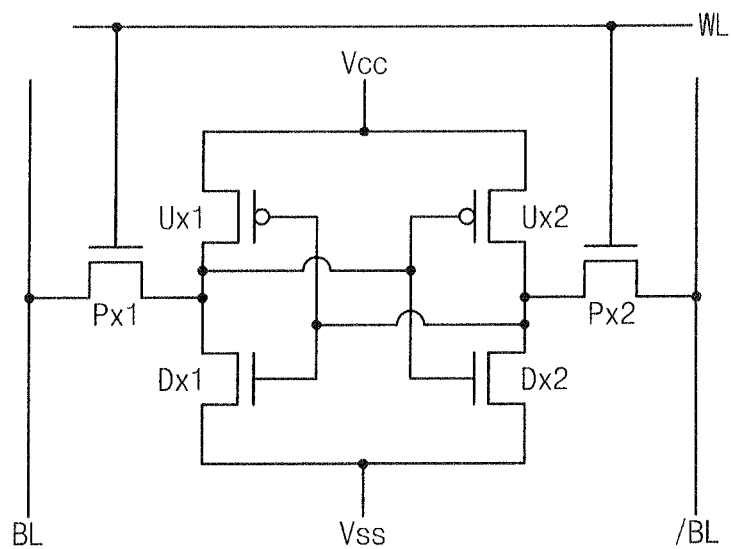
FIG. 1 is a circuit diagram illustrating a semiconductor device according to an exemplary embodiment of the inventive concept.

Hereinafter, exemplary embodiments of the inventive concept will be described in detail with reference to the accompanying drawings. It should be noted, however, that the inventive concept is not limited to the following exemplary embodiments, and may be implemented in various forms.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present.

The same reference numerals or the same reference designators may denote the same elements throughout the specification and drawings.

FIG. 1 is a circuit diagram illustrating a semiconductor device according to an exemplary embodiment of the inventive concept.

Referring to FIG. 1, a semiconductor device according to an exemplary embodiment of the inventive concept may be a static random access memory (SRAM) device. In a unit cell of the semiconductor device, two complementary metal-oxide semiconductor (CMOS) inverters may constitute a flip-flop circuit to realize a memory terminal. Additionally, the unit cell may further include pass transistors Px1 and Px2 for reading/writing data from/to the memory terminal. The two CMOS inverters include two pull down transistors Dx1 and Dx2 and two pull up transistors Ux1 and Ux2 which constitute the flip-flop circuit as illustrated in FIG. 1. The pass transistors Px1 and Px2 are connected to a word line WL and bit lines BL and /BL.

Figure 2:
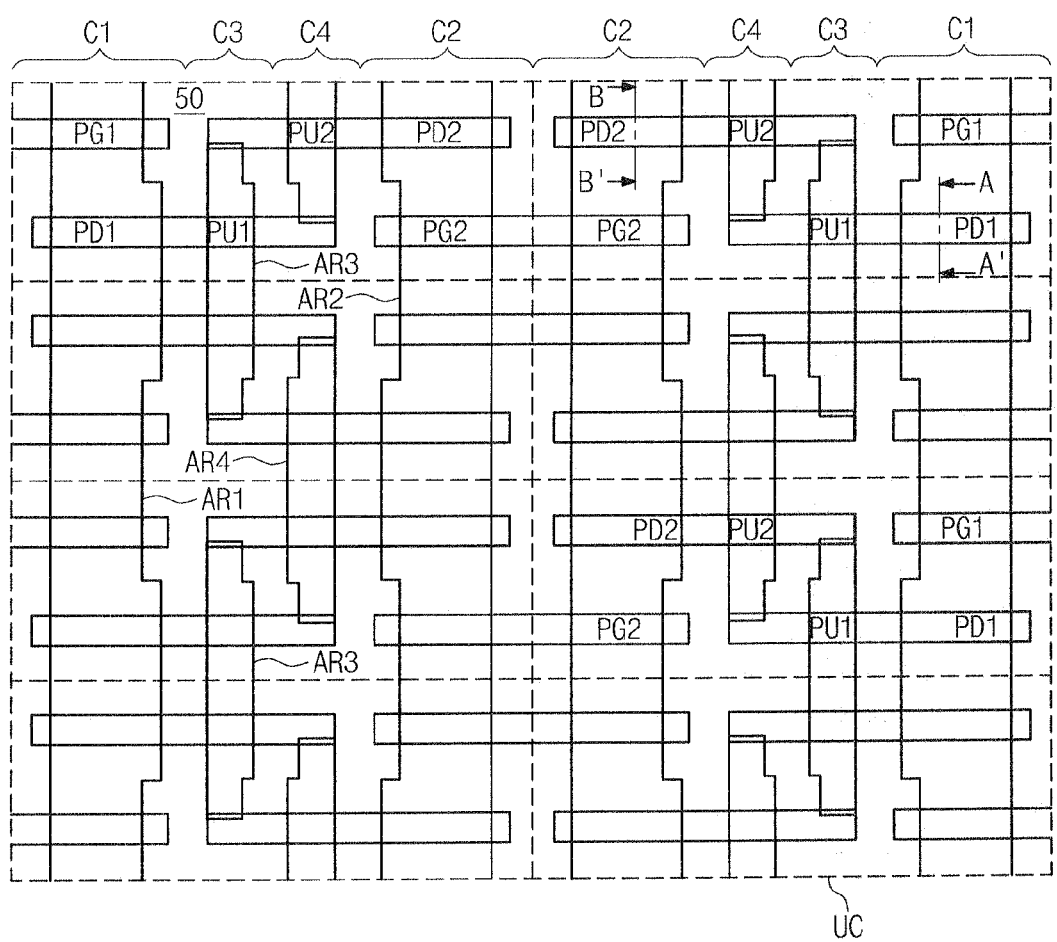
FIG. 2 is a plan view illustrating a semiconductor device according to an exemplary embodiment of the inventive concept.
Figure 3:
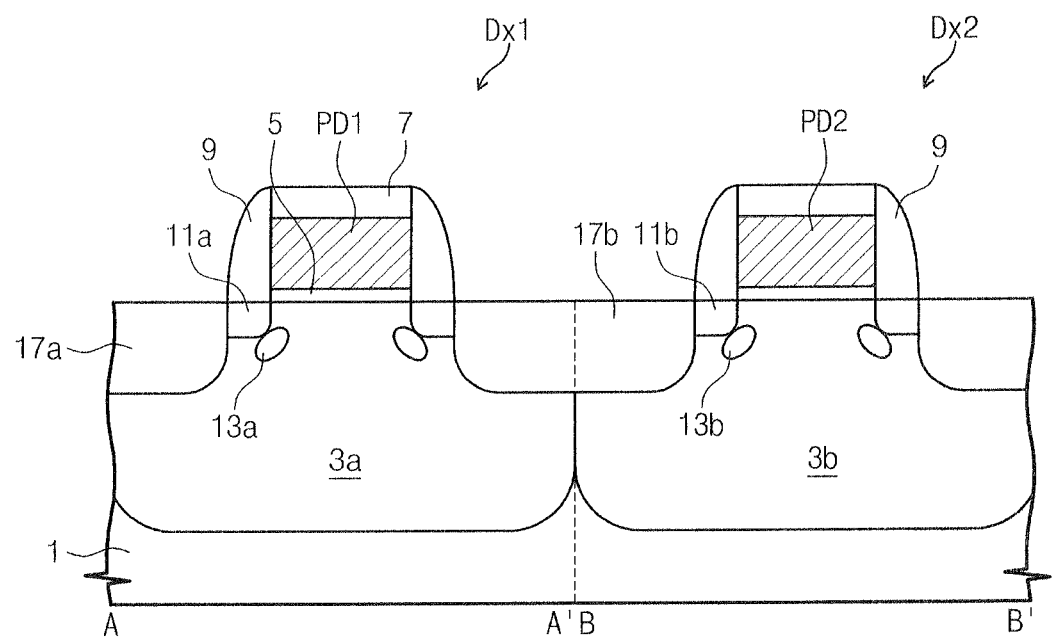
FIG. 3 is a cross-sectional view taken along lines A-A and B-B of FIG. 2.

FIG. 2 is a plan view illustrating a semiconductor device according to an exemplary embodiment of the inventive concept. FIG. 3 is a cross-sectional view taken along lines A-A and B-B of FIG. 2.

Referring to FIGS. 2 and 3, a device isolation layer 50 may be disposed at a semiconductor substrate 1 (hereinafter, referred to as 'a substrate') to define first, second, third, and fourth active regions AR1, AR2, AR3, and AR4. The first to fourth active regions AR1, AR2, AR3, and AR4 are disposed in first, second, third, and fourth columns C1, C2, C3, and C4, respectively.

A first pull down gate electrode PD1 and a first pass gate electrode PG1 are disposed on the first active region AR1 in a unit memory cell region UC. A second pull down gate electrode PD2 and a second pass gate electrode PG2 are disposed on the second active region AR2 in the unit memory cell region UC. For example, the first and second active regions AR1 and AR2 may be active regions for N-type field effect transistors. First and second pull up gate electrodes PU1 and PU2 are disposed on the third and fourth active regions AR3 and AR4 in the unit memory cell region UC, respectively. For example, the third and fourth active regions AR3 and AR4 may be active regions for P-type field effect transistors. The first and second active regions AR1 and AR2 may be horizontally and vertically symmetric with respect to the device isolation layer 50 between the third and fourth active regions AR3 and AR4. Likewise, the third and the fourth active regions AR3 and AR4 may be horizontally and vertically symmetric with respect to the device isolation layer 50 therebetween. The first gate electrodes PG1, PD1, and PU1 and the second gate electrodes PG2, PD2, and PU2 may be horizontally and vertically symmetric with respect to the device isolation layer 50 between the third and fourth active regions AR3 and AR4, respectively. The unit memory cell region UC of FIG. 2 may be arranged to be horizontally and vertically symmetric with respect to other unit memory cell regions.

Cross-sectional views of the pull down transistors Dx1 and Dx2 will now be described as an example.

Referring to FIG. 3, the first pull down transistor Dx1 is disposed in the first column C1, and the second pull down transistor Dx2 is disposed in the second column C2. The first pull down transistor Dx1 includes a first channel region 3a disposed in the substrate 1, the first pull down gate electrode PD1 disposed on the first channel region 3a, first low-concentration dopant regions 11a disposed in the substrate 1 at both sides of the first pull down gate electrode PD1, first halo regions 13a, and first high-concentration dopant regions 17a. The second pull down transistor Dx2 includes a second channel region 3b disposed in the substrate 1, the second pull down gate electrode PD2 disposed on the second channel region 3b, second low-concentration dopant regions 11b disposed in the substrate 1 at both sides of the second pull down gate electrode PD2, second halo regions 13b, and second high-concentration dopant regions 17b. A gate insulating layer 5 is disposed between the substrate 1 and each of the gate electrodes PD1 and PD2. A top surface and a sidewall of each of the gate electrodes PD1 and PD2 are covered by a capping layer 7 and a spacer 9, respectively. The gate insulating layer 5 and the first pull down gate electrode PD1, which are sequentially stacked, may constitute a first pull down gate pattern. The gate insulating layer 5 and the second pull down gate electrode PD2, which are sequentially stacked, may constitute a second pull down gate pattern.

In an exemplary embodiment of the inventive concept, the first pull down transistor Dx1 may have substantially the same structure as the second pull down transistor Dx2. Additionally, threshold voltages of the first and second pull down transistors Dx1 and Dx2 may be the same as each other. However, if mask misalignment is present during a process of forming the semiconductor device of FIG. 3, the first and second pull down transistors Dx1 and Dx2 may have threshold voltages different from each other. If the threshold voltages of the first and second pull down transistors Dx1 and Dx2 are different from each other, read, write, and/or data storing operations may fail.

Figure 4:
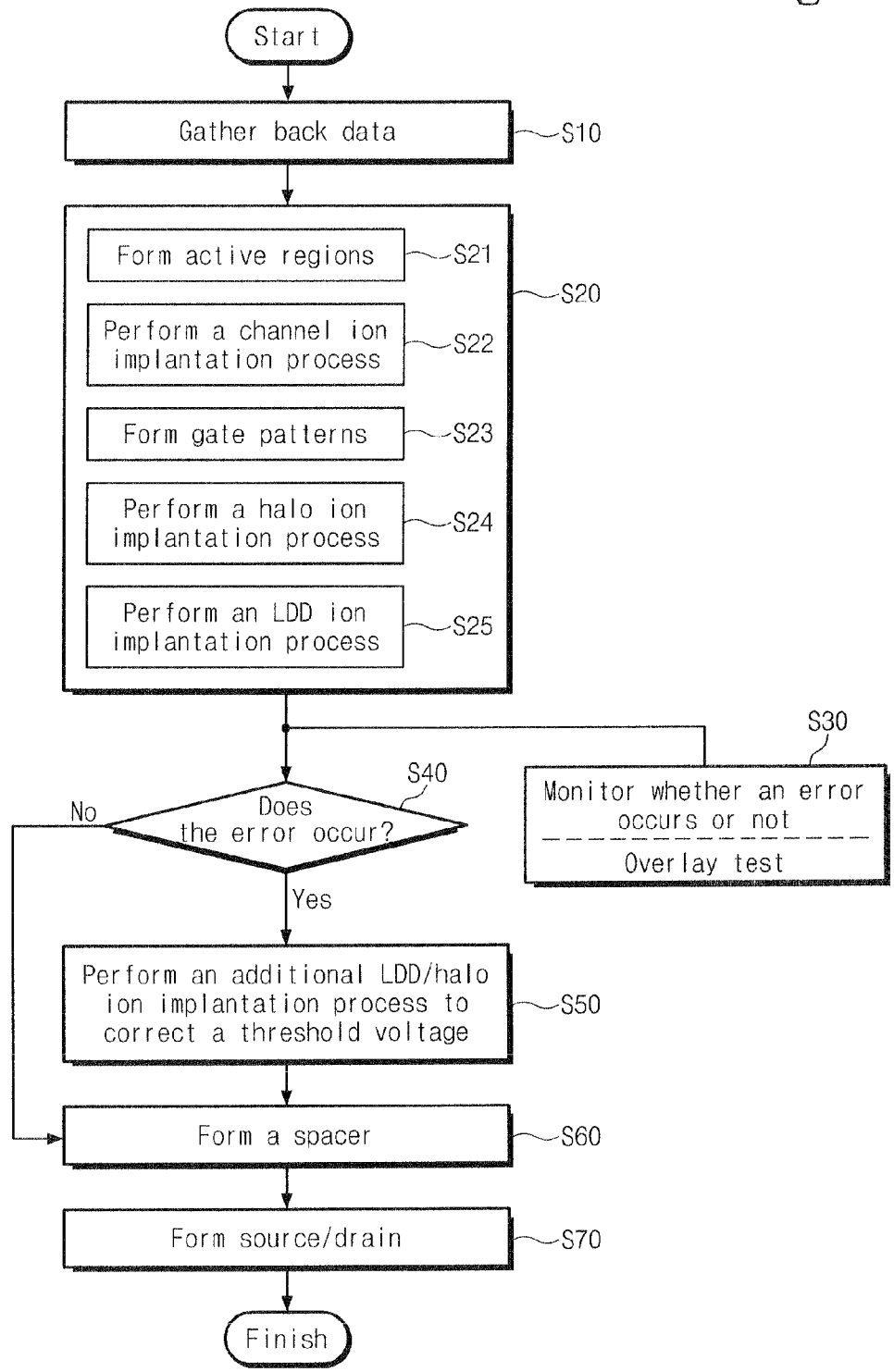
FIG. 4 is a flowchart illustrating a method of forming a semiconductor device according to an exemplary embodiment of the inventive concept.

According to exemplary embodiments of the inventive concept, dispersion of the threshold voltages may be lessened. FIG. 4 is a flowchart illustrating a method of forming a semiconductor device according to an exemplary embodiment of the inventive concept.

Referring to FIG. 4, back data may be gathered (S10). In S10, processes affecting the threshold voltages may be found from processes of forming the transistors of FIG. 3. Those processes that have a greater affect than others may be identified here. Additionally, in S10, information about the threshold voltages of transistors formed under various misalignment conditions may be gathered. If mask misalignment occurs in a few of the processes, a variation degree of the threshold voltage according to a misalignment degree may also be determined. Factors that may have a greatly affect the threshold voltage may include mask misalignment, a type of dopant, a dopant concentration, and a tilt angle used in the formation of each of the channel regions 3a and 3b, the low-concentration dopant regions (or lightly doped drain (LDD) regions) 11a and 11b, and the halo regions 13a and 13b. Solutions for correcting the threshold voltages may be found in S10.

After the back data are gathered, the transistors of FIGS. 2 and 3 are formed (S20). Each of processes in S20 may be monitored for the occurrence of an error (S30). For example, an overlay test may be performed.

In more detail, referring to FIGS. 2 to 4, the device isolation layer 50 is formed on or in the substrate 1 to define the first to fourth active regions AR1, AR2, AR3, and AR4 (S21).

A channel ion implantation process may be performed using a first ion implantation mask having an opening corresponding to the first and second columns C1 and C2 to form the first and second channel regions 3a and 3b in the substrate 1 (S22). For example, the channel ion implantation process may be performed using P-type dopant ions. If channel regions are formed in the third and fourth active regions AR3 and AR4 of the third and fourth columns C3 and C4, N-type dopant ions may be implanted.

A gate insulating layer 5, a conductive layer, and a capping layer 7 may be sequentially formed on the substrate 1, and then, may be patterned to form gate electrodes PD1 and PD2 (S23).

A halo ion implantation process may be performed using a second ion implantation mask having an opening corresponding to the first and second columns C1 and C2 to form the first and second halo regions 13a and 13b in the substrate 1 under the gate electrodes PD1 and PD2 (S24). For example, the halo ion implantation process may use P-type dopant ions, and a tilt angle of the halo ion implantation process may be equal to or greater than about 5 degrees.

An LDD ion implantation process may be performed using a third ion implantation mask having an opening corresponding to the first and second columns C1 and C2 to form the first and second low-concentration dopant regions 11a and 11b in the substrate 1 at both sides of the gate electrodes PD1 and PD2 (S25). For example, the LDD ion implantation process may use N-type dopant ions. A tilt angle of the LDD ion implantation process may be about 0 degree.

When each of the processes S21 to S25 is finished, it is monitored for the occurrence of an error occurs (S30). For example, it is determined whether an error occurs in at least one of the ion implantation processes S22, S24, and S25 (S40). For example, the overlay test may be performed to determine whether the mask is misaligned after each of the processes S22, S24 and S25.

If an error does not occur in the processes S21 to S25, subsequent processes are performed. In other words, the spacer 9 is formed to cover the sidewalls of the gate electrode (S60), and then, the high-concentration dopant regions (or source/drain regions) 17a and 17b are formed (S70).

If at least one error occurs in the process S21 to S25, an additional LDD ion implantation process or an additional halo ion implantation process may be performed to correct the threshold voltage (S50). In this case, a transistor on which the additional LDD or halo ion implantation process is performed may be determined from the back data obtained in S10. Additionally, a type of dopant, a dose, and/or a tilt angle of the additional LDD or halo ion implantation process may be determined from the back data obtained in S10.

Figure 5:
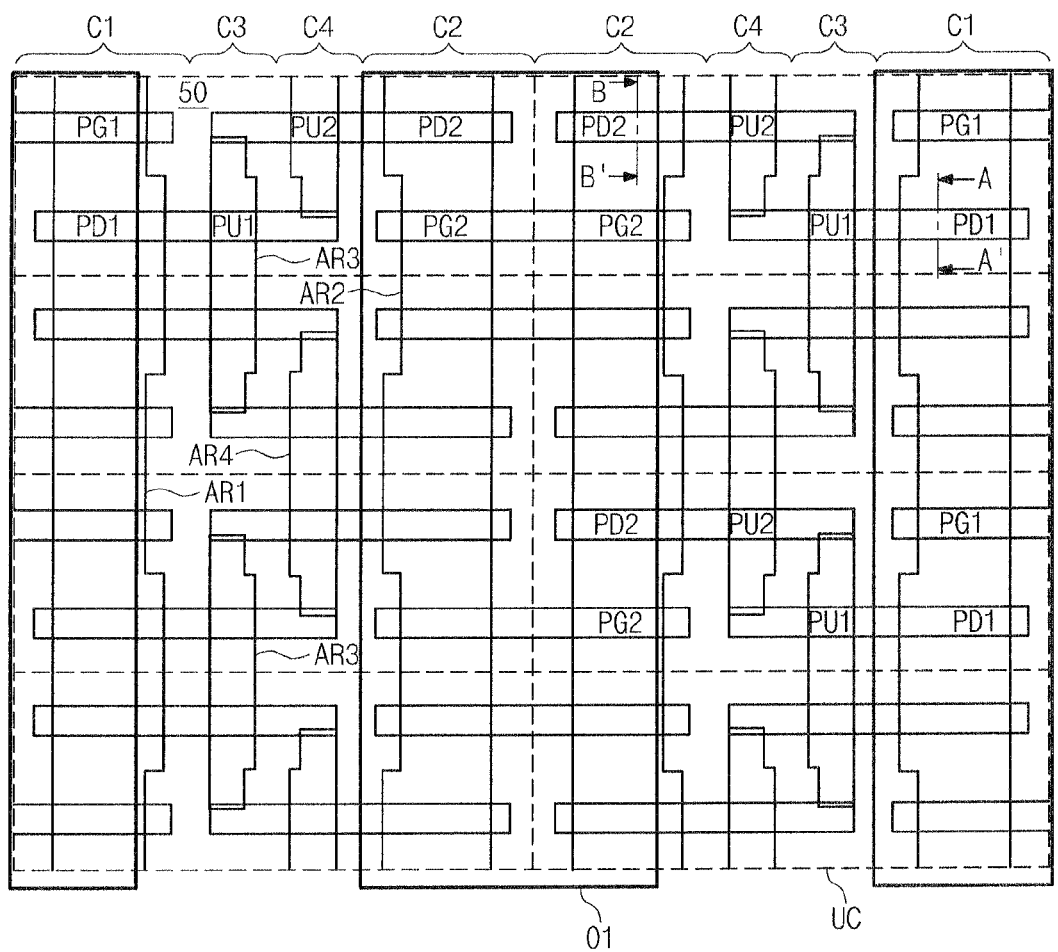
FIG. 5 is a plan view illustrating an example of a mask misalignment.

For example, referring to FIG. 5, if openings O1 of the second ion implantation mask are misaligned to the left, the halo regions 13a and 13b may be incompletely formed on the right side of the first and second active regions AR1 and AR2. In this case, the additional halo ion implantation process may be performed using openings O2 illustrated in FIG. 6 on the right side of the first and second active regions AR1 and AR2.

In an exemplary embodiment of the inventive concept, if an error occurs in the processes S21 to S25, threshold voltages of the first and second pull down transistors Dx1 and Dx2 may be predicted from the back data before the additional LDD or halo ion implantation process is performed and after the processes S21 to 25 are finished. A difference value between the predicted threshold voltages may be calculated. A threshold voltage of a problematic transistor may be corrected through the additional LDD or halo ion implantation process by using the difference value. For example, according to the difference value, the threshold voltage of the transistor may be increased by increasing the dose of the halo ion implantation process. The threshold voltage of the transistor may be reduced by increasing the dose of the LDD ion implantation process.

In more detail, the mask misalignment may occur as illustrated in FIG. 5, such that the formation of the second halo region 13b in the second pull down transistor Dx2 may be less complete than the formation of the first halo region 13a in the first pull down transistor Dx1. In this case, the predicted threshold voltage of the second pull down transistor Dx2 may be lower than the predicted threshold voltage of the first pull down transistor Dx1.

Figure 6:
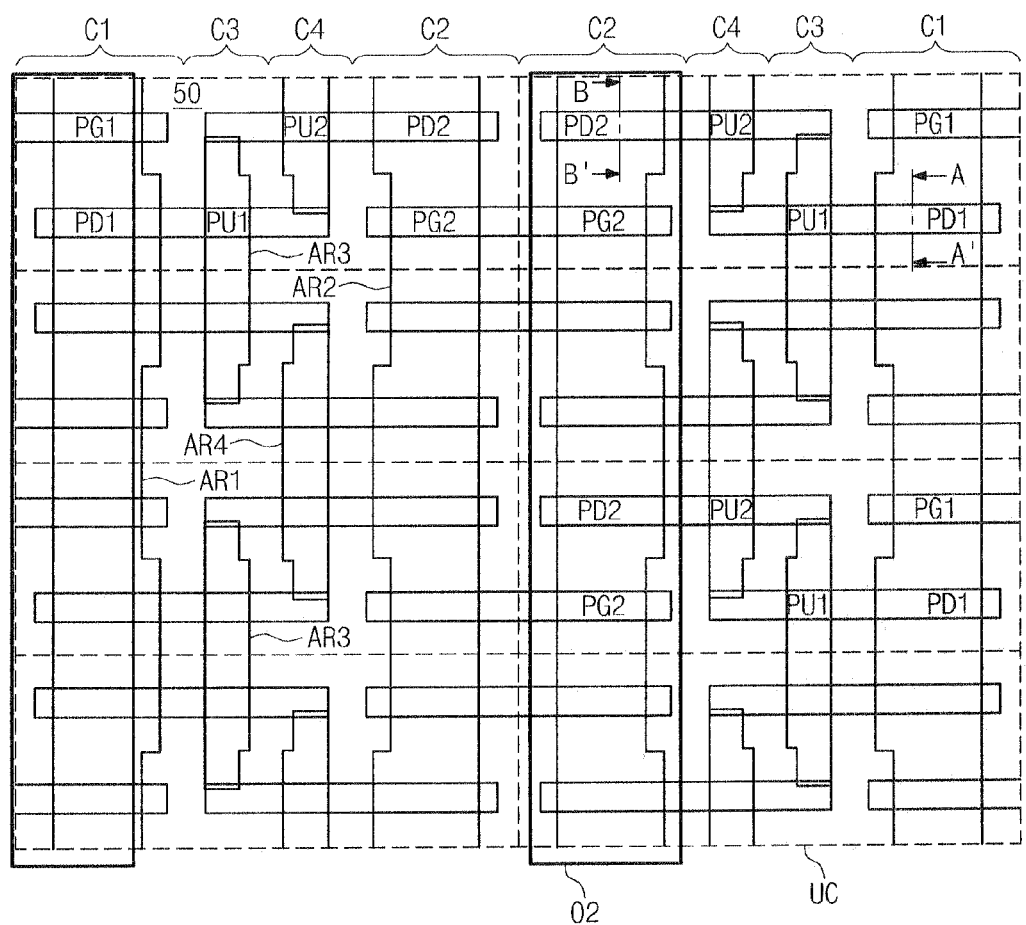
FIGS. 6 and 7 are plan views illustrating openings of an ion implantation mask used in an additional ion implantation process according to an exemplary embodiment of the inventive concept.

The threshold voltage of the second pull down transistor Dx2 may be increased such that the threshold voltages of the first and second pull down transistors Dx1 and Dx2 are equal to each other. To do this, an additional ion implantation mask having the opening O2 exposing the second column C2 disposed at the right side as illustrated in FIG. 6 may be manufactured, and then, the additional halo ion implantation process may be performed using the additional ion implantation mask.

Figure 7:
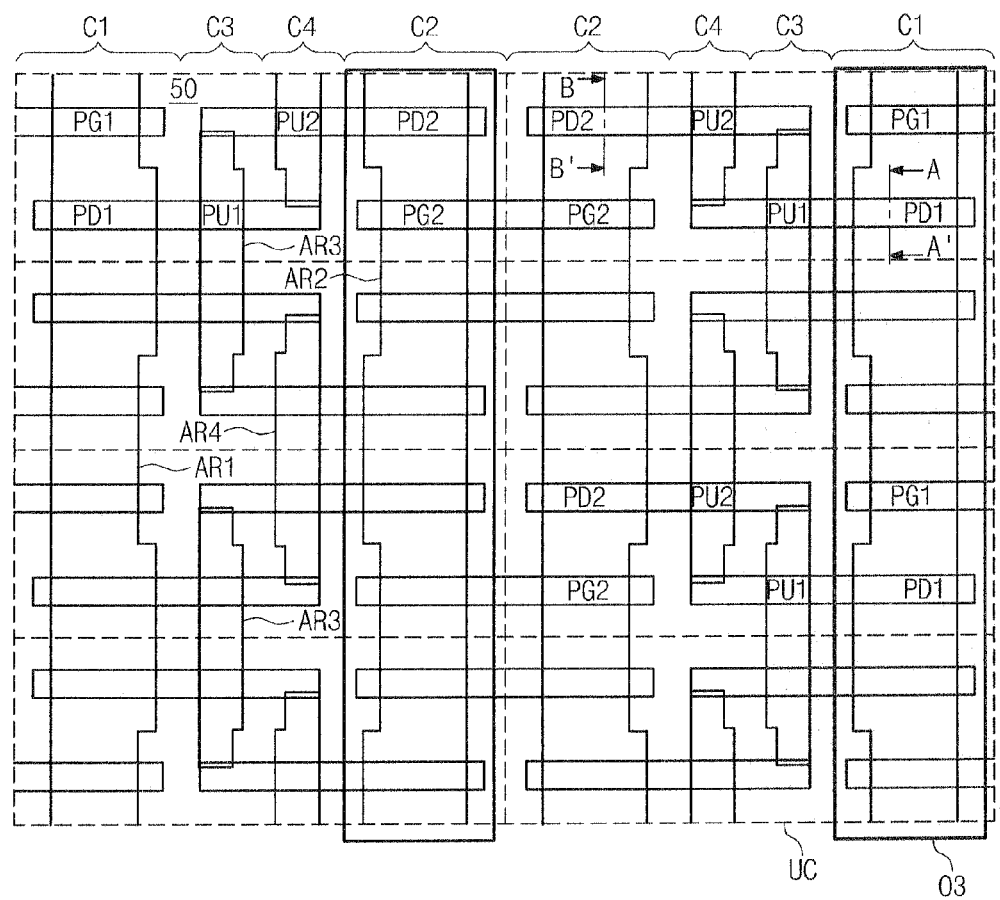

Alternatively, the threshold voltage of the first pull down transistor Dx1 may be reduced such that the threshold voltages of the first and second pull down transistors Dx1 and Dx2 are equal to each other. To do this, as illustrated in FIG. 7, an additional ion implantation mask may be manufactured to have an opening O3 exposing the first column C1, and then, the additional LDD ion implantation process may be performed using the additional ion implantation mask.

If the predicted threshold voltage of the second pull down transistor Dx2 is higher than the predicted threshold voltage of the first pull down transistor Dx1, an additional LDD ion implantation process may be performed on the second pull down transistor Dx2 to reduce the threshold voltage of the second pull down transistor Dx2. In addition, to increase the threshold voltage of the first pull down transistor Dx1, the additional halo ion implantation process may be performed on the first pull down transistor Dx1.

After the threshold voltage is corrected as described above, the spacer 9 may be formed (S60). The high-concentration dopant regions (or source/drain regions) 17a and 17b may also be formed (S70). The dispersion of the threshold voltages of the first and second pull down transistors Dx1 and Dx2 may be improved by the methods described above, such that an operating error of the semiconductor device may be prevented.

Figure 8:
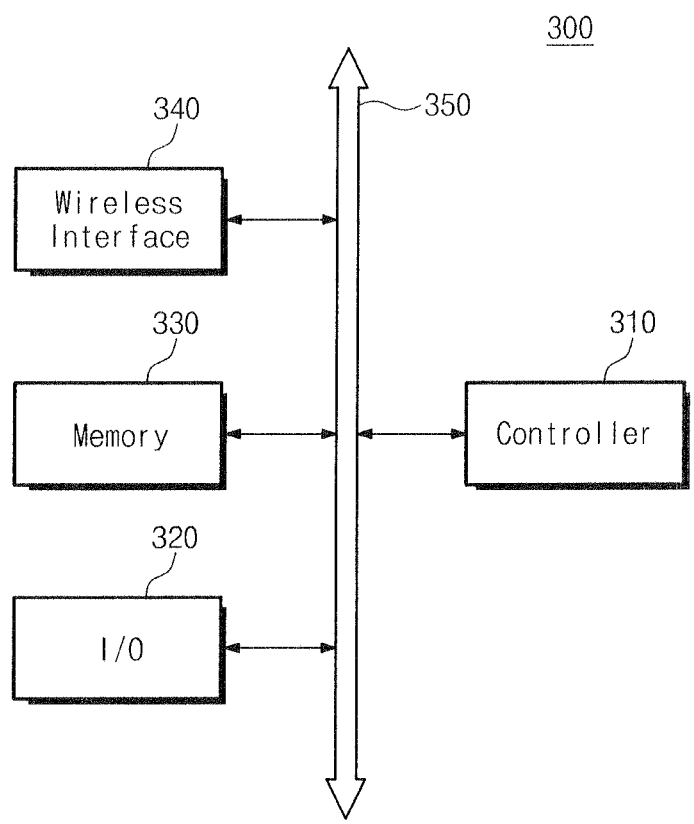
FIG. 8 is a block diagram illustrating an electronic device including a semiconductor device according to an exemplary embodiment of the inventive concept.
Figure 9:
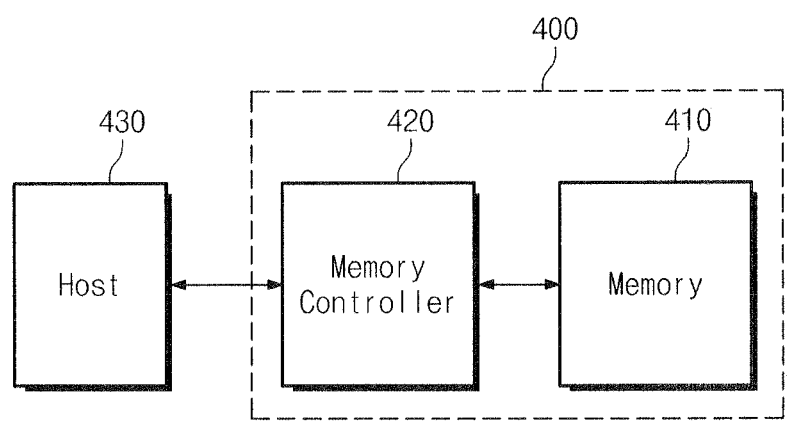
FIG. 9 is a block diagram illustrating a memory system including a semiconductor device according to an exemplary embodiment of the inventive concept.

FIG. 8 is a block diagram illustrating an electronic device including a semiconductor device according to an exemplary embodiment of the inventive concept. FIG. 9 is a block diagram illustrating a memory system including a semiconductor device according to an exemplary embodiment of the inventive concept.

Referring to FIG. 8, an electronic device 300 including the semiconductor memory device according one of the exemplary embodiments of the inventive concept will be described. The electronic device 300 may be used as a wireless communication device, for example, a personal digital assistant (PDA), a laptop computer, a portable computer, a web tablet, a mobile phone, a digital music player, or any other device capable of transmitting/receiving information in a wireless environment.

The electronic device 300 may include a controller 310, an input/output (I/O) unit 320 such as a keypad, a keyboard and/or a display, a memory device 330, and a wireless interface unit 340 which are coupled with each other through a data bus 350. For example, the controller 310 may include at least one of a microprocessor, a digital signal processor, a microcontroller or other logic devices. The other logic devices may have a similar function to any one of the microprocessor, the digital signal processor and the microcontroller. The memory device 330 may store, for example, commands performed by the controller 310. Additionally, the memory device 330 may be used for storing user data. The memory device 330 includes the semiconductor memory device according to one of the exemplary embodiments of the inventive concept.

The electronic device 300 may use the wireless interface unit 340 for transmitting/receiving data to/from a wireless communication network via a radio frequency (RF) signal. For example, the wireless interface unit 340 may include an antenna or a wireless transceiver.

The electronic device 300 according to an exemplary embodiment of inventive concept may use a communication interface protocol such as a third generation communication system (e.g., CDMA, GSM, NADC, E-TDMA, and/or WCDMA.

Referring to FIG. 9, the semiconductor memory device according to one of the exemplary embodiments of the inventive concept may be applied to a memory system 400.

The memory system 400 may include a memory device 410 for storing data and a memory controller 420. The memory controller 420 may read or write data from/to the memory device 410 in response to a read/write request of a host 430. The memory controller 420 may make an address mapping table for mapping an address provided from the host 430 (e.g., a mobile device or a computer system) into a physical address of the memory device 410. The memory device 410 may include the semiconductor memory device according to one of the exemplary embodiments of the inventive concept.

According to an exemplary embodiment of the inventive concept, an additional ion implantation for the formation of a low-concentration dopant region or a halo region is performed to reduce the dispersion of threshold voltages of transistors. Thus, an operating error of a semiconductor device may be prevented.

While the inventive concept has been shown and described with reference to exemplary embodiments thereof, it will be apparent to those of ordinary skill in the art that various changes in form and detail may be made thereto without departing from the spirit and scope of the inventive concept as defined by the following claims.

What is claimed is:

1. A method of forming a semiconductor device, comprising:
   forming a first transistor and a second transistor on a substrate, wherein forming the first transistor and the second transistor comprises:
   forming a device isolation layer on or in the substrate to define a first active region corresponding to a first column and a second active region corresponding to a second column;
   performing a channel ion implantation process on the first and second active regions;
   forming a first gate pattern and a second gate pattern on the first active region and the second active region, respectively;
   performing a low-concentration dopant ion implantation process to form a first low-concentration dopant region in the substrate at first and second sides of the first gate pattern and a second low-concentration dopant region in the substrate at first and second sides of the second gate pattern; and
   performing a halo ion implantation process to form a first halo region and a second halo region contacting the first low-concentration dopant region and the second low-concentration dopant region under the first gate pattern and the second gate pattern respectively;
   monitoring processes of forming the first and second transistors to find an error, wherein the error is found by determining a mask misalignment in the low-concentration dopant ion implantation process or the halo ion implantation process;
   using back data to determine a variation degree of a threshold voltage corresponding to the mask misalignment, wherein the back data includes a plurality of threshold voltage variation degrees corresponding to different misalignment degrees; and
   performing an additional ion implantation process to adjust a threshold voltage of the low-concentration dopant region or the halo region on the first transistor or the second transistor corresponding to the determined variation degree.

2. The method of claim 1, wherein monitoring the processes of forming the first and second transistors comprises:
   performing an overlay test to find the mask misalignment.

3. The method of claim 1, further comprising, before forming the first and second transistors:
   forming preliminary transistors under various mask misalignment conditions; and
   measuring threshold voltages of the preliminary transistors to gather the back data.

4. The method of claim 1, wherein if a threshold voltage of the first transistor is smaller than a threshold voltage of the second transistor, the additional ion implantation process for the formation of the halo region is performed using an ion implantation mask which exposes the first active region and covers the second active region.

5. The method of claim 1, wherein if a threshold voltage of the first transistor is greater than a threshold voltage of the second transistor, the additional ion implantation process for the formation of the low-concentration dopant region is performed using an ion implantation mask which exposes the first active region and covers the second active region.

6. The method of claim 1, wherein if a threshold voltage of the second transistor is smaller than a threshold voltage of the first transistor, the additional ion implantation process for the formation of the halo region is performed using an ion implantation mask which exposes the second active region and covers the first active region.

7. The method of claim 1, wherein if a threshold voltage of the second transistor is greater than a threshold voltage of the first transistor, the additional ion implantation process for the formation of the low-concentration dopant region is performed using an ion implantation mask which exposes the second active region and covers the first active region.

8. The method of claim 1, further comprising, after performing the additional ion implantation process:
   forming a first spacer and a second spacer on sidewalls of the first and second gate patterns, respectively; and
   forming a first high-concentration dopant region and a second high-concentration dopant region in the substrate adjacent to sidewalls of the first and second spacers, respectively.

9. The method of claim 1, wherein the additional ion implantation process changes a threshold voltage of the first or second transistor.

10. A method of monitoring a semiconductor device comprising:
    receiving an error signal indicating an error has occurred when forming a first transistor on a substrate, wherein the error is found by determining a mask misalignment in a first ion implantation process, and wherein the first ion implantation process is monitored for errors while it is being performed;
    using back data to determine a variation degree of a threshold voltage corresponding to the mask misalignment, wherein the back data includes a plurality of threshold voltage variation degrees corresponding to different misalignment degrees; and
    outputting, based on the error, a command instructing a process used in the forming of the first transistor to be repeated, wherein the process includes a second ion implantation process and wherein the second ion implantation process adjusts a threshold voltage of the first transistor according to the determined variation degree.

11. The method of claim 10, wherein the command includes a mask type to he used in the repeated process.

12. The method of claim 11, Wherein the mask type is based on a threshold voltage difference between the first transistor and a second transistor.

13. A method of forming a semiconductor device, comprising:
    performing a first ion implantation process on a first transistor and a second transistor; and
    performing, in response to an error indication, a second ion implantation process on the first transistor,
    wherein the second ion implantation process adjusts a threshold voltage of the first transistor and uses a different mask than a mask used in the first ion implantation process,
    wherein the error indication is generated by determining a mask misalignment in the first ion implantation process,
    wherein back data is used to determine a variation degree of the threshold voltage which corresponds to the mask misalignment, and
    wherein the back data includes a plurality of threshold voltage variation degrees corresponding to different misalignment degrees.

14. The method of claim 13, wherein the second ion implantation process includes a halo ion implantation process or a lightly doped drain ion implantation process.

15. The method of claim 14, wherein the first and second ion implantation processes are the same type.

16. The method of claim 13, further comprising forming a spacer on sidewalls of each of the first and second transistors.

17. The method of claim 13, wherein the threshold voltage of the first transistor and a threshold voltage of the second transistor are the same after the second ion implantation process.

18. The method of claim 13, wherein the semiconductor device is a static random access memory.

19. The method of claim 13, wherein a low-concentration dopant region of the first transistor is formed to have a different type of dopant, a different dopant concentration, or a different region shape from that of a low-concentration dopant region of the second transistor after the second ion implantation process.

20. The method of claim 13, wherein a halo region of the first transistor is formed to have a different type of dopant, a different dopant concentration, or a different region shape from that of a halo region of the second transistor after the second ion implantation process.

* * * * *